(12) United States Patent
Schoch

(10) Patent No.: US 6,515,454 B2
(45) Date of Patent: Feb. 4, 2003

(54) METHOD AND SYSTEM FOR DETERMINING THE CAPACITY OF A BATTERY

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/074,183

(22) Filed: Feb. 12, 2002

(65) Prior Publication Data

US 2002/0130637 A1 Sep. 19, 2002

(30) Foreign Application Priority Data

Feb. 13, 2001 (DE) .......................................... 101 06 508

(51) Int. Cl.$^7$ ................................................. H02J 7/00
(52) U.S. Cl. ....................................................... 320/132
(58) Field of Search ........................... 320/132; 324/425, 324/426, 427; 703/13

(56) References Cited

U.S. PATENT DOCUMENTS

| | | | | |
|---|---|---|---|---|
| 5,349,540 A | * | 9/1994 | Birkle et al. ................ | 364/578 |
| 6,362,598 B2 | * | 3/2002 | Laig-Horstebrock et al. .... | 320/132 |
| 6,441,586 B1 | * | 8/2002 | Tate, Jr. et al. ............. | 320/132 |

FOREIGN PATENT DOCUMENTS

EP          0 471 698          2/1992

* cited by examiner

Primary Examiner—Edward H. Tso
Assistant Examiner—Pia Tibbits
(74) Attorney, Agent, or Firm—Kenyon & Kenyon

(57) ABSTRACT

A method for estimating the capacity of a battery, including the following steps: estimation of a steady-state voltage $U_R$, an internal resistance $R_1$ and an internal voltage drop $U_K$ of the battery, caused by a density difference in the battery acid; initialization of a model describing the battery in order to estimate the capacity, using estimated values $U_R$, $R_1$ and $U_K$; stimulation of the initialized model with predefined load current characteristic $I_{Batt,stim}$, in particular a simulated load current characteristic of a consumer in operative connection with the battery, in order to obtain a voltage response $U_{Batt,pred}$ of the model, representing the battery voltage given the predefined load current characteristic; comparison of the voltage response $U_{Batt,pred}$ of the model with a predefinable, minimal battery voltage $U_{Batt,limit}$, and estimation of the capacity of the battery by comparing $U_{Batt,pred}$ and $U_{batt,limit}$.

11 Claims, 2 Drawing Sheets

METHOD AND SYSTEM FOR DETERMINING THE CAPACITY OF A BATTERY

FIELD OF THE INVENTION

The present invention relates to a method and a system for determining the capacity of a battery, especially a motor vehicle starter battery.

BACKGROUND INFORMATION

When using safety-critical, electrical consumers in a motor vehicle, such as brake-by-wire or steer-by-wire systems and electrohydraulic brake systems (EHB systems) or start-stop systems, the energy accumulators supplying these systems must be constantly monitored and, in particular, checked as to their capacity prior to the occurrence of a respective load, so that failures can be recognized and signaled in time, and measures taken to increase the capacity of the energy accumulators, for instance by increasing the charging voltage and/or by switching off consumers, for instance.

Several methods are known for predicting the capacity of starter batteries. In this context, for instance, the determining variables for the battery capacity, such as state of charge and internal battery resistance, are determined, for example, by evaluating the steady-state voltage, and by measuring voltage and current at the start. Alternatively, model-based status monitoring is utilized with ongoing measuring of voltage, current and temperature, and an expected power output of the battery is precalculated on the basis of these quantities. The first method-type has the disadvantage of allowing a recalibration of the state of charge and internal resistance only under particular operating conditions (rest phase or start). At other times, extrapolations are required, leading to errors in the forecasting of the battery capacity, in particular in so-called taxi operation, in which rest phases are rare or very brief. Furthermore, in such methods dynamic changes in the capacity, for example, after demand on the starter battery, are not taken into consideration.

Model-based methods constantly estimate the state of charge and internal resistance during vehicle operation, as well as dynamic voltage drops in the battery, thereby allowing a good prediction of the battery capacity. In practice, however, these methods are very cost and labor intensive, since a battery model covering the entire working range of the battery, as is required in this case, is generally strongly non-linear and includes many parameters to be estimated.

Such a method for determining the state of charge and additional physical variables of a rechargeable electrical accumulator, i.e. a battery, such as state of wear, age, manufacturing tolerances, prior history and charging efficiency, is known from European Patent No. 0 471 698. In this case, process input variables of the energy accumulator are measured and processed in a computing device, whereby, according to the principle of indirect measuring, a predefinable model of non-linear, multiparametrical functions representing the state of charge and the physical quantities to be determined as well as their physical interrelationship, is compared with the measured process input variables, the model parameters being adapted for the subsequent measuring in case of deviations. In this method, a multiparametrical description in the form of the model and a heuristic parametrization are used to determine the state of charge and the physical variables to be determined, the description having more parameters than process input variables, and the under-determined set of solutions of the model being determined first, and the state of charge and the additional physical variables subsequently being determined with the aid of the parametrization as estimation, using characteristics and data of known energy accumulators.

SUMMARY OF THE INVENTION

It is an object of the present invention to provide a model which is as simple as possible for estimating a battery performance, in particular the capacity of a battery.

According to the present invention, the capacity of a battery, in particular a motor vehicle starter battery, as it pertains to predefined load current characteristics, especially load current characteristics of specific consumers, is determined by adapting a simple model having a minimum of estimatable parameters, which is applicable to the respective load instance. The model can be implemented as a hardware or software model. Determination of the battery parameters can be carried out during normal vehicle operation and does not rely on extended rest phases or a high-current load such as exists during the start. As a consequence, prompt adaptation of the parameters after changing or recharging the battery is also possible. In addition to static quantities, such as load state and internal resistance, the dynamic voltage drop in the battery immediately after connection of load is also determined, which allows an altogether very precise prediction of the capacity of the battery.

Advantageously, the parameters utilized within the framework of the estimation according to the present invention, i.e., steady-state voltage $U_R$, internal resistance $R_1$ and internal voltage drop $U_K$, are determined with the aid of a monitoring device, especially a Kalman filter, which, on the basis of a measured battery voltage and/or a measured battery temperature and/or a measured battery current, estimates parameters $U_R$, $R_E$ and $U_K$ by utilizing a model. This model may also be designed as a hardware or software model. It is advantageous if the two models mentioned for describing the battery are essentially compatible.

When comparing voltage response $U_{Batt,pred}$ with a predefinable minimal battery voltage $U_{Batt,limit}$, the minimal value of the voltage response $\min(U_{batt,pred})$ is expediently taken into account. Through such a comparison it is possible to state clearly whether the battery is able to supply a minimal battery voltage $U_{Batt,limit}$ required for the reliable operation of the consumer in question.

Expediently, the capacity of the battery is determined using a formula of the form $$SOH = (\min(U_{Batt,pred}(t)) - U_{batt,limit}) / (U_{Batt,norm} U_{Batt,limit}),$$

$U_{Batt,norm}$ being the minimal terminal voltage occurring when a new, fully charged and balanced battery is loaded with the particular consumer at room temperature. SOH=1 for such a battery. The voltage drop could be greater and the SOH value lower, as a result of aging, discharge and prior loading of the battery, and at low temperatures. At SOH=0, the minimal requirement is barely met. It should be pointed out that SOH is the common abbreviation of the English term "State Of Health" of the battery.

Furthermore, it is advantageous to determine the state of charge (SOC) of the battery on the basis of the determined steady-state voltage. This provides an additional static quantity for describing the battery state. Apart from the static quantities, such as state of charge and internal resistance, a very precise prediction can now be made regarding the capacity of the battery, because the dynamic voltage drop in the battery occurring immediately after a connection of a load can also be determined, as described above.

DETAILED DESCRIPTION

Figure 1:
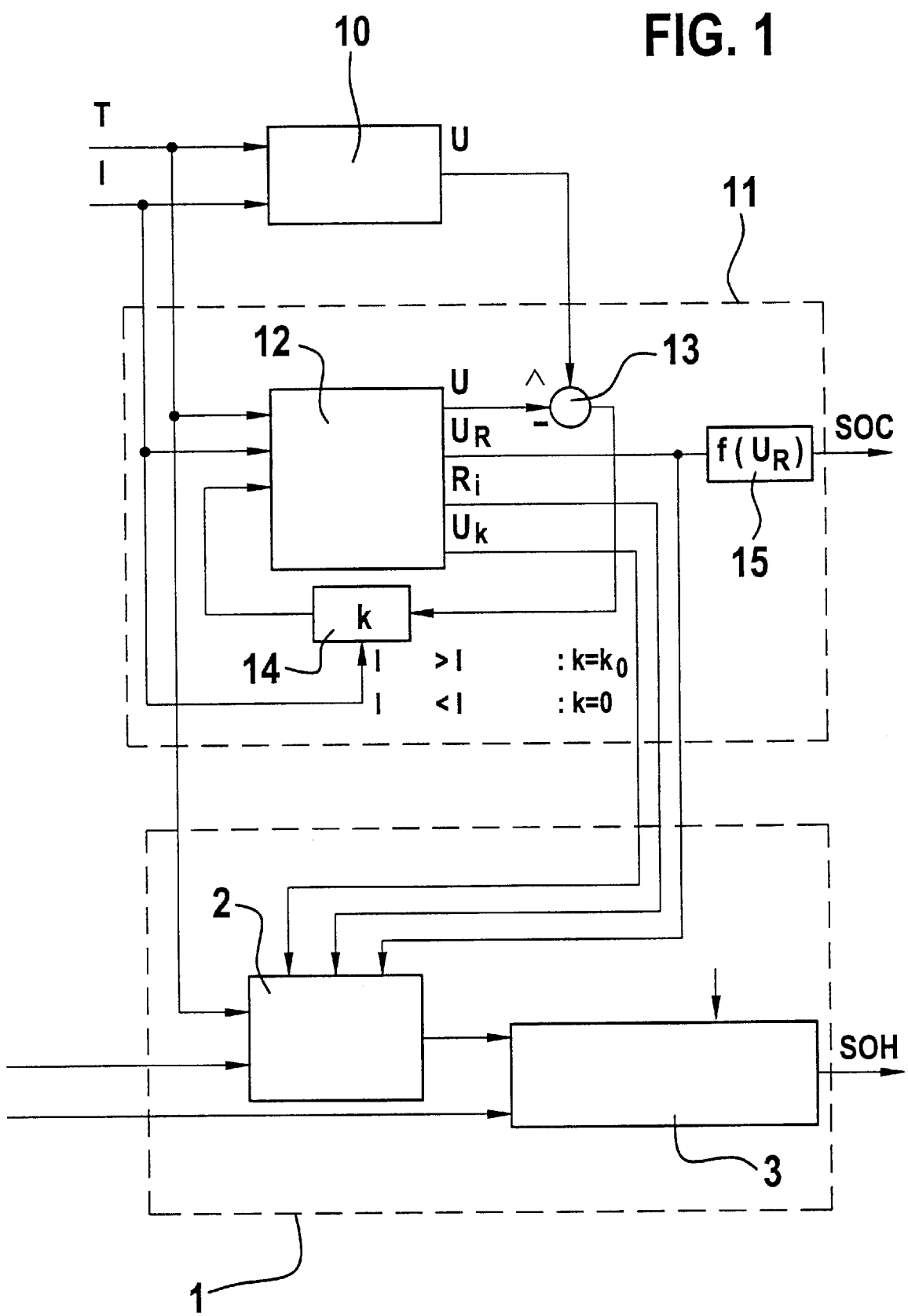
FIG. 1 shows a schematic block diagram representing the estimation of the capacity of a battery according to the present invention.

In FIG. 1, a motor vehicle battery as a whole is designated by reference numeral 10. Battery 10 has a battery current $I_{Batt}$, a battery temperature $T_{Batt}$ and a battery voltage $U_{Batt}$, each of which is measured.

The measured quantities indicated are forwarded to a monitoring device designated as a whole by reference numeral 11, e.g., a Kalman filter. Monitoring device 11 uses a model representing battery 10, which is here simply designated by reference numeral 12. Model 12 estimates an estimated battery voltage $U_{Batt}\hat{}$ on the basis of input variables $T_{Batt}$ and $I_{Batt}$. In this case, the model calculation is adjusted by feedback of the error $U_{Batt}-U_{Batt}\hat{}$ between measured and calculated battery voltage (comparator 13).

Advantageously, the model compensation is implemented only when working points are present which are relevant for the model validity, for instance, (when discharging currents are counted positively) if the discharging current of the battery 10>0, i.e., $I_{Batt}>I_{Batt,min}$. In this case, at 14, a value $k=k_0 \times (U_{Batt}-U_{Batt}\hat{})$ is supplied to the model calculation as third input variable, in addition to measured values $T_{Batt}$ and $I_{Batt}$.

In the other working points, for which $I_{Batt} \leq I_{Batt,min}$ applies, the error feedback into the calculation is interrupted, i.e., k is equated with 0. It is possible in such a second working range to calculate the steady-state voltage $U_R$ of the battery from current integral $Q=-\int I_{Batt} dt$ and from steady-state voltage $R_O$ which was estimated last, especially during the existence of the first working range, according to the equation $U_R = U_{RO} + Q/C$.

For both working ranges, the steady-state voltage value $U_R$ resulting from the calculation or estimation by device 11, has a further functional calculation applied to it to obtain battery state of charge (SOC). The battery state is expediently determined in accordance with an equation of the formula $SOC = f(U_R) = (U_R - U_{R,min})/(U_{R,max} - U_{R,min})$. The application of the function to ascertained steady-state voltage $U_R$ occurs at 15.

In this context, $U_{R,min}$ and $U_{R,max}$ are the respective minimum and maximum steady-state voltages at the acid-density values established by the battery manufacturer for an empty or fully charged battery.

It is clear that not only steady-state voltage $U_R$ is estimated by model 12, but also internal resistance $R_1$ and internal voltage drop $U_K$, which is caused by density differences in the battery acid. With these estimation results of model 12, the parameters for determining the capacity of the battery are at hand.

In order to determine the capacity of battery 10, estimated values $U_R$, $R_1$ and $U_K$ are fed to a predictor, which as a whole is designated by reference numeral 1, and which contains the same model for describing battery 10 as Kalman filter 11. The models describe the battery performance in a particular load case with sufficient precision. The model corresponding to model 12 is designated here by reference numeral 2.

Model 2 is initialized with quantities $U_R$, $R_1$ and $U_K$ that were determined by Kalman filter 11, and stimulated with a load current characteristic $I_{Batt,stim}(t)$ typical for a consumer being considered. Such consumers could be an electromagnetic brake (EMB), an electrohydraulic brake (EHB) or a starter device.

On the basis of input variables $I_{Batt,stim}$, $U_R$, $R_1$ and $U_K$, voltage response $U_{Batt,pred}$ of the battery is estimated with regard to the predefined load current characteristic with the aid of model 2. The difference between the minimal value of the voltage response, $\min(U_{Batt,pred}(t))$ of the model on the basis of the stimulated load, and minimal battery voltage $U_{Batt,limit}$ required for the reliable operation of the specific consumer, represents an absolute measure for the capacity of battery 10.

This subtraction $\Delta U_{Batt} = \min(U_{Batt,pred}(t)) - U_{Batt,limit}$, is carried out in a comparator 3 of predictor 1.

The measure designated SOH is more suitable for the comparison of different batteries. In this case, the battery capacity measure SOH is determined according to the formula $$SOH = (\min(U_{Batt,pred}(t)) - U_{Batt,limit})/(U_{Batt,norm} - U_{Batt,limit})$$

$U_{Batt,norm}$ is the minimal terminal voltage occurring in response to the loading of a new, fully charged and balanced battery with the particular consumer at room temperature. For such a battery, SOH=1. Through aging, discharging and prior load of the battery, as well as due to low temperatures, the voltage drop caused by the load becomes greater, and the SOH value thus becomes lower. At SOH=0, the minimal requirements of the battery are just barely met.

Figure 2:
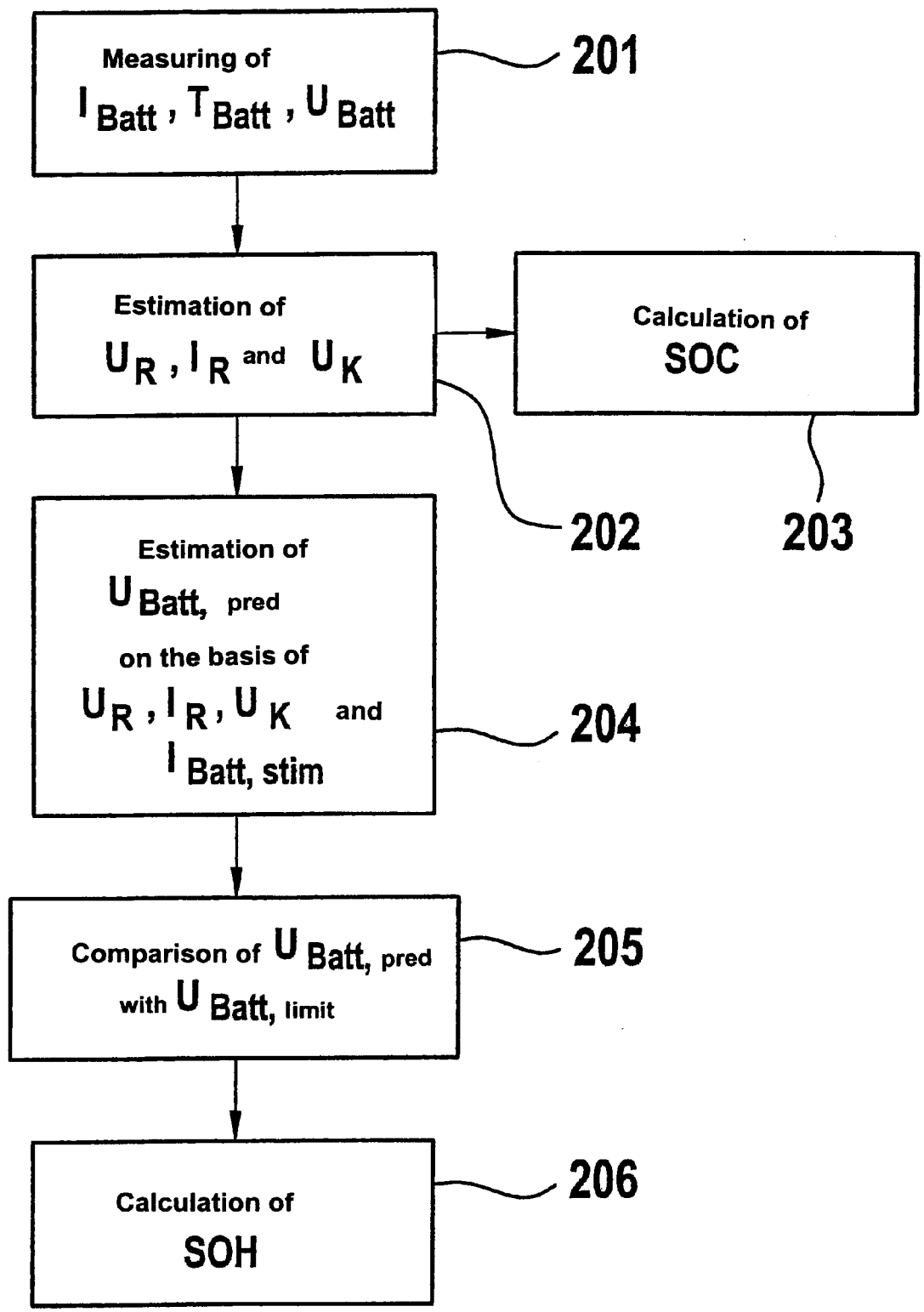
FIG. 2 shows a flow chart depicting a preferred embodiment of the method according to the present invention.

The steps of the method according to the present invention are now explained with the aid of FIG. 2.

In a step 201, battery temperature $T_{Batt}$, battery current $I_{Batt}$, and battery voltage $U_{Batt}$ are measured. With the help of a Kalman filter, which uses a model 12 representing the battery, in step 202, open-circuit voltage $U_R$, internal resistance $R_1$ and voltage drop $U_K$ resulting from density differences in the battery acid are estimated. A voltage value $U_{Batt}\hat{}$ 0also estimated in this context can be adjusted using measured battery voltage value $U_{Batt}$ and likewise fed to model 12 as input variable. Steady-state voltage value $U_R$ is advantageously used to also calculate the state of charge SOC of the battery (step 203).

In a subsequent step 204, a voltage response $U_{Batt,pred}(t)$ of the battery because of a simulated load by an individual specific consumer is estimated in a predictor on the basis of a model 2, which advantageously describes the same battery model as model 12. For this purpose, the model calculation is initialized by the variables $U_R$, $R_1$ and $U_K$ and stimulated with load current characteristic $I_{Batt,stim}(t)$ typical for the consumer in question.

In a subsequent step 205, voltage response $U_{Batt,pred}(t)$ is compared with a minimal battery voltage $U_{Batt,limit}$ required for the reliable operation of the specific consumer. In this context, the difference is expediently calculated between the minimal value of voltage response $(\min(U_{Batt,pred}(t))$ of the model in response to the load, and minimal battery voltage $U_{Batt,limit}$ required for the reliable operation of the particular consumer.

In a subsequent step 206, the value SOH is calculated as a relative measure to represent the battery capacity on the basis of determined voltage difference value $\Delta U_{Batt} = \min(U_{Batt,pred}(t)) - U_{Batt,limit}$ according to the aforementioned formula.

What is claimed is:

1. A method for estimating a capacity of a battery, comprising:
   estimating a steady-state voltage, an internal resistance, and an internal voltage drop of the battery caused by a density difference in a battery acid;

initializing a model describing the battery in order to estimate the capacity in accordance with estimated values of the steady-state voltage, the internal resistance, and the internal voltage drop of the battery;

stimulating the initialized model with a predefined load current characteristic in order to obtain a voltage response of the initialized model, representing a battery voltage, given the predefined load current characteristic; and estimating the capacity of the battery by comparing the voltage response of the initialized model with a predefinable minimal battery voltage.

2. The method according to claim 1, wherein:

the predefined load current characteristic includes a simulated load current characteristic of a consumer in operative connection with the battery.

3. The method according to claim 1, further comprising:

determining the steady-state voltage, the internal resistance, and the internal voltage drop of the battery by a monitoring device that produces the estimated values for the steady-state voltage, the internal resistance, and the internal voltage drop of the battery on the basis of at least one of a measured battery voltage, a measured battery temperature, and a measured battery current in accordance with the initialized model describing the battery.

4. The method according to claim 3, wherein:

the monitoring device includes a Kalman filter.

5. The method according to claim 1, wherein:

in the comparison of the voltage response with the predefinable minimal battery voltage, a minimal value over time of the voltage response is used.

6. The method according to claim 5, further comprising:

determining the capacity of the battery in accordance with a formula:

$$SOH = (\min(U_{Batt,pred}(t)) - U_{Batt,limit}) / (U_{Batt,norm} - U_{Batt,limit}),$$

wherein $\min(U_{Batt,pred}(t))$ is the minimal value over time of the voltage response, $U_{Batt,limit}$ is the predefinable minimal battery voltage, and $U_{Batt,norm}$ is a terminal voltage occurring at room temperature in response to a loading of a new, fully charged and balanced battery with a particular consumer.

7. The method according to claim 1, further comprising:

determining a load state of the battery on the basis of the estimated value for the steady-state voltage.

8. A system for estimating a capacity of a battery, comprising:

a predictor for estimating a battery voltage occurring given a particular load current characteristic, in which a steady-state voltage, an internal resistance an internal voltage drop caused by a density difference in a battery acid, and a particular load current characteristic are able to be supplied as input variables to a model used by the predictor to represent the battery, wherein:

an estimated battery voltage is obtained from the model as a response representing an estimation of the battery voltage with respect to the particular load current characteristic, and the estimated battery voltage is compared to a limiting voltage in order to estimate the capacity of the battery.

9. The system according to claim 8, wherein:

the battery includes a motor vehicle starter battery.

10. The system according to claim 8, further comprising:

a monitoring device for estimating the steady-state voltage, the internal resistance, and the internal voltage drop caused by the density difference in the battery acid.

11. The system according to claim 10, wherein:

the monitoring device includes a Kalman filter.

* * * * *

UNITED STATES PATENT AND TRADEMARK OFFICE
CERTIFICATE OF CORRECTION

PATENT NO. : 6,515,454 B2
DATED : February 4, 2003
INVENTOR(S) : Eberhard Schoch It is certified that error appears in the above-identified patent and that said Letters Patent is hereby corrected as shown below:

Column 4,
Line 36, change "$U_{Batt}$^0also" to -- $U_{Batt}$^ also --

Column 5,
Line 38, change "($U_{Batt,norm}U_{Batt,limit}$)" to -- ($U_{Batt,norm}$ - $U_{Batt,limit}$) --

Signed and Sealed this

Third Day of February, 2004

JON W. DUDAS
*Acting Director of the United States Patent and Trademark Office*